(12) United States Patent
Van De Waerdt

(10) Patent No.: US 7,221,612 B2
(45) Date of Patent: May 22, 2007

(54) SDRAM ADDRESS MAPPING OPTIMIZED FOR TWO-DIMENSIONAL ACCESS

(75) Inventor: Jan-Willem Van De Waerdt, Hamburg (DE)

(73) Assignee: NXP B.V., Endhoven (NL)

( * ) Notice: Subject to any disclaimer, the term of this patent is extended or adjusted under 35 U.S.C. 154(b) by 175 days.

(21) Appl. No.: 10/535,783

(22) PCT Filed: Nov. 14, 2003

(86) PCT No.: PCT/IB03/05138

§ 371 (c)(1),
(2), (4) Date: May 20, 2005

(87) PCT Pub. No.: WO2004/047112

PCT Pub. Date: Jun. 3, 2004

(65) Prior Publication Data

US 2006/0047890 A1    Mar. 2, 2006

(51) Int. Cl.
*G11C 8/00* (2006.01)
*G11C 7/00* (2006.01)

(52) U.S. Cl. .............................. 365/230.03; 365/189.01

(58) Field of Classification Search ........... 365/230.03, 365/189.01, 63

See application file for complete search history.

(56) References Cited

U.S. PATENT DOCUMENTS

| 5,831,926 | A | 11/1998 | Lacey et al. | |
|---|---|---|---|---|
| 6,223,265 | B1 * | 4/2001 | Kawasaki et al. | 711/167 |
| 6,347,063 | B1 * | 2/2002 | Dosaka et al. | 365/233 |
| 2002/0054537 | A1 * | 5/2002 | Pascucci | 365/236 |

* cited by examiner

*Primary Examiner*—Son Dinh

(57) ABSTRACT

Typically, a bulk of the memory space utilized by an SOC (103) is located in cheaper off-chip memory devices such as Synchronous Dynamic Random Access Memory (SDRAM) memories (104). These memories provide a large capacity for data storage, at a relatively low cost. It is common for SOC devices to communicate with each other through these off-chip memory devices. Because of the large amount of data being processed on state of the art SOCs, the data bandwidth to and from the SDRAM memories is a critical source, which if improperly managed results in bottlenecks. Thus, a novel address mapping scheme, which has improved efficiency for two-dimensional memory transactions is proposed for mapping on-chip memory transactions. This novel mapping scheme aims to decrease these bottlenecks, by segmenting the data sequence into portions being smaller than the size of a row of a block of the SDRAM memories.

17 Claims, 5 Drawing Sheets

SDRAM ADDRESS MAPPING OPTIMIZED FOR TWO-DIMENSIONAL ACCESS

This invention relates to the area of SDRAM memories and more specifically to the area of communicating to and from SDRAM memories.

In modem day systems on chip (SOC) architectures, multiple devices are integrated together into the chip to provide system functionality. Devices that are integrated range from programmable processor elements to dedicated hardware elements. It is typical for SOCs to have a Unified Memory Architecture (UMA), to allow for simplicity in the communication and synchronization between the on-chip devices. For example, a device generates a series of data elements starting at a certain address A in the UMA, another device uses these data elements from the UMA starting at address A In other words, the devices on the SOC have the same view when addressing the data elements in the UMA. It is obvious that a UMA simplifies the communication between devices since address translation between devices is obviated.

Typically, a bulk of the memory space utilized by the SOC is located in cheaper off-chip memory devices such as Synchronous Dynamic Random Access Memory (SDRAM) memories. These memories provide a large capacity for data storage, at a relatively low cost. It is common for SOC devices to communicate with each other through these off-chip memory devices. For instance, if device 1 generates data elements for storage in the off-chip memory device at a predetermined address, then device 2 can retrieve these data elements at the predetermined address from the off-chip memory device. Because of the large amount of data being processed on state of the art SOCs, the data bandwidth to and from the SDRAM memories is a critical resource, which if improperly managed results in SOC performance bottlenecks. For the processing speed of SOC devices to be as high as possible, efficient utilization of this limited bandwidth resource is critical.

A need therefore exists to increase an amount of data that is transferable to and from the SOC using this limited data bandwidth. It is therefore an object of the invention to provide a memory address mapping that overcomes the deficiencies of the prior art by providing an increased memory bandwidth for transactions between the SOC and off-chip memory devices.

In accordance with an aspect of the invention there is provided a method of storing data in an external memory comprising the steps of: providing data for storage in the external memory; segmenting the data for storage into data portions, each portion consisting of fewer data elements than a number of data elements for filling a data line contained within a bank in the external memory; and, storing each portion of data elements within one of a different data line located within the external memory and a same data line within different banks of the external memory.

In accordance with an aspect of the invention there is provided an apparatus comprising: a first memory bank having a first memory location in the form of a data line for storing a number of data elements; a second memory bank having a second memory location in the form of a data line for storing a same number of data elements; and, a memory controller circuit for receiving a data line of data elements for storage and for segmenting the data line of data elements into data portions, each portion consisting of fewer data elements than the number of data elements for filling a data line contained within the first bank and the second bank in the external memory.

In accordance with yet another aspect of the invention there is provided a method of writing a line of data elements comprising the steps of: providing a first memory bank having a first memory location in the form of a data line for storing a number of data elements; providing a second memory bank having a second memory location in the form of a data line for storing a same number of data elements; segmenting the data line of data elements into data portions, each portion consisting of fewer data elements than a number of data elements for filling a data line located in each of a first and a second bank in the external memory; writing the first portion of data elements to the first memory location within the first memory bank, terminating the writing of the first portion data elements to the first memory location prior to complete filling of the first memory location; switching to the second memory bank; writing the second portion of data elements to the second memory location within the second memory bank; and, terminating the writing of the second portion data elements to the second memory location prior to completely filling of the second memory location.

The invention will now be described with reference to the drawings in which.

Figure 4:
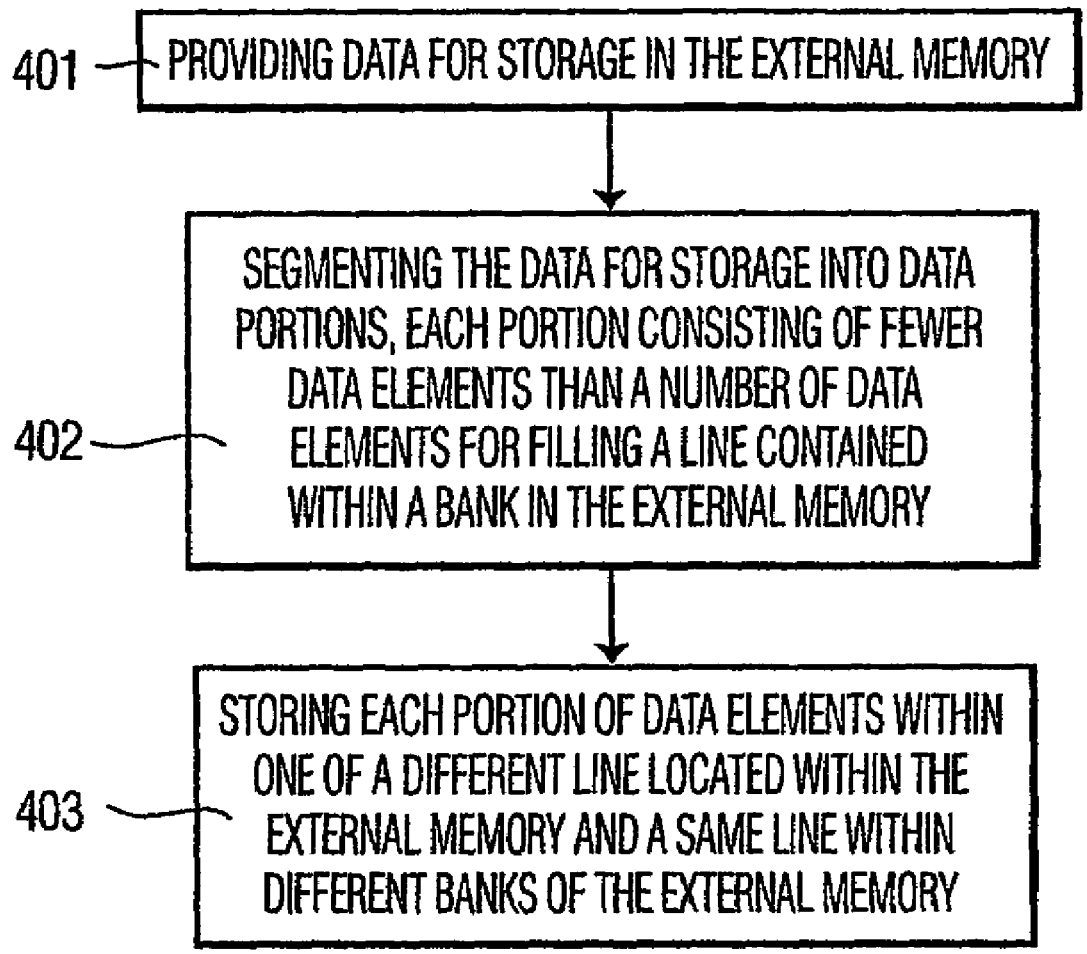
Figure 5:
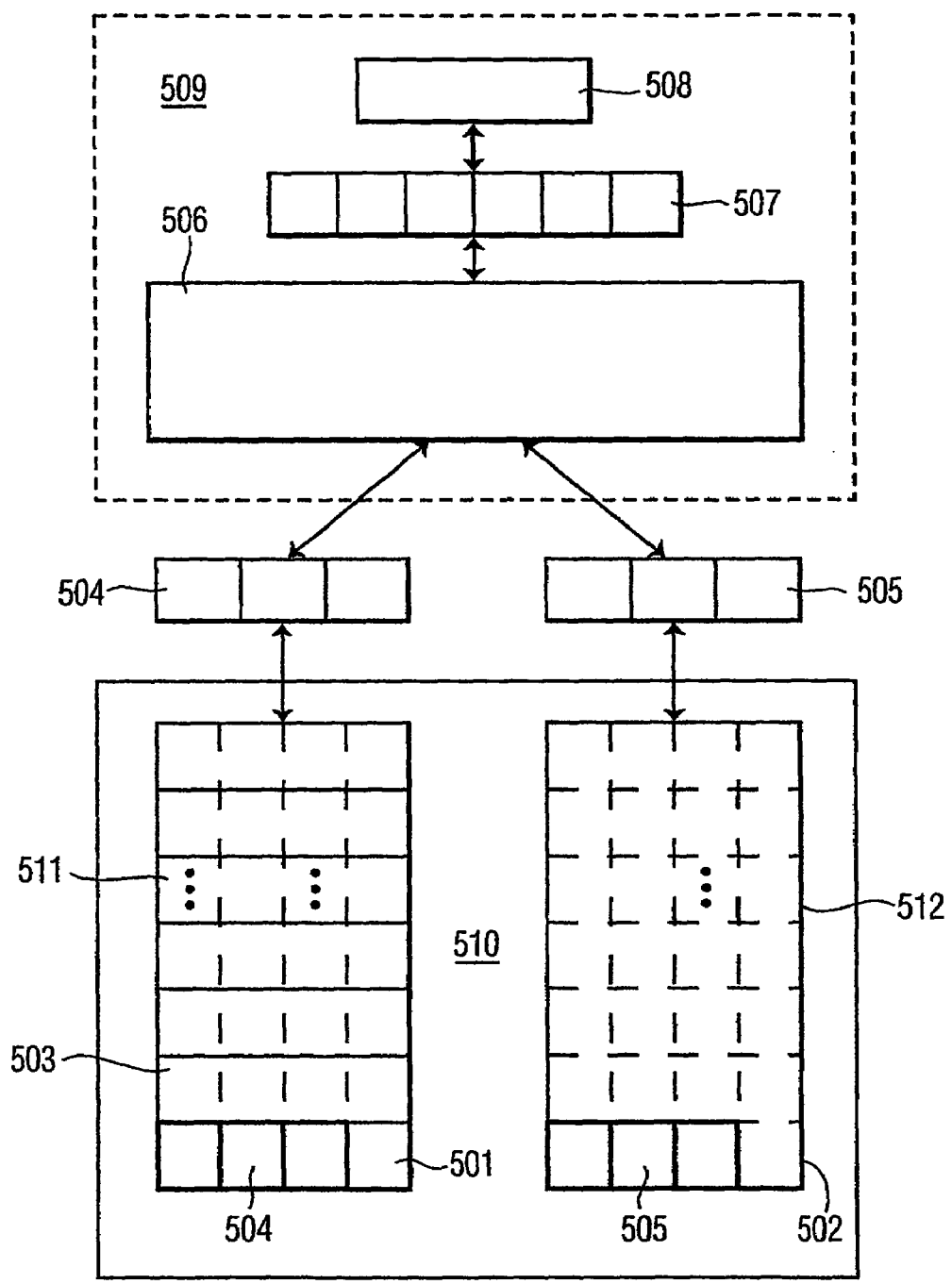

FIG. 4 outlines steps taken for mapping of an on-chip transaction to an off-chip transaction; and, FIG. 5 illustrates an apparatus according an embodiment of the invention for use in mapping of an on-chip transaction to an off-chip transaction.

Figure 1:
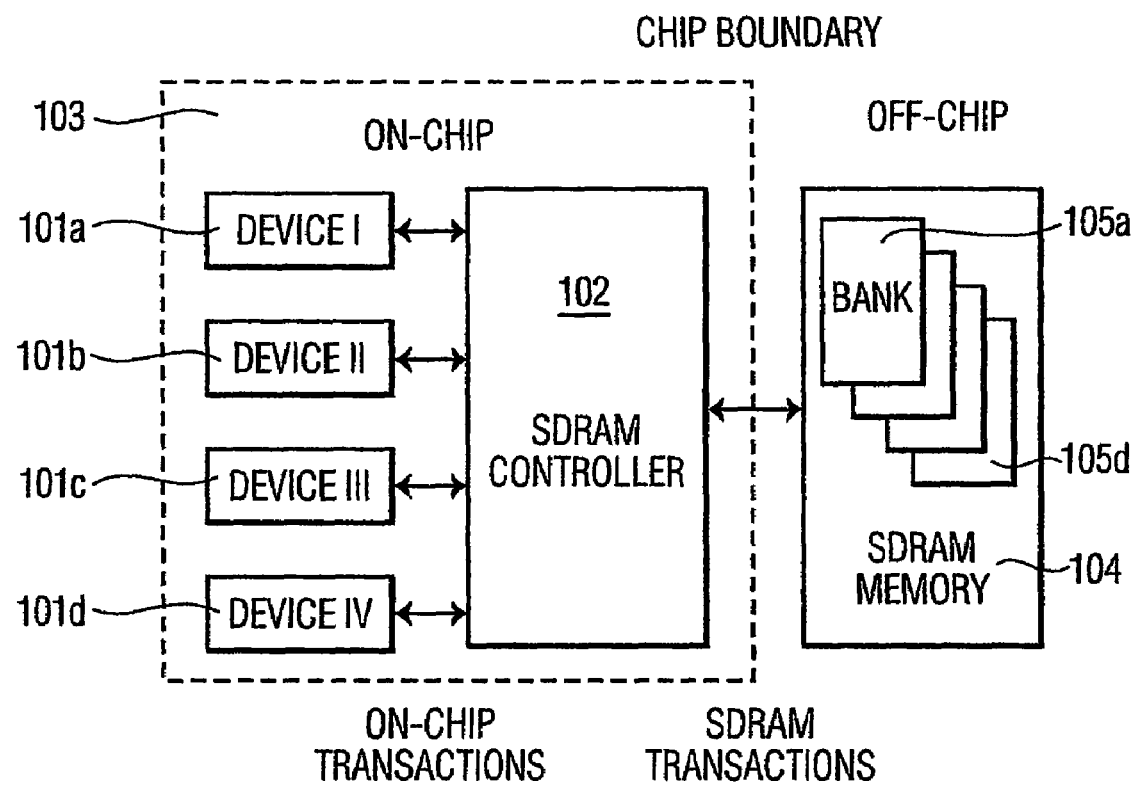
FIG. 1 illustrates a prior art overview of communication between on-chip devices, an external memory controller and off-chip External memory.

FIG. 1 illustrates a prior art overview of communication between system-on-chip (SOC) devices 103, including an external memory controller 102 and off-chip external memory 104, in the form of an SDRAM. The external memory controller 102 handles communication to and from the off-chip external memory 104 having multiple memory banks 105a through 105d. The external memory controller 102 receives requests from SOC devices 101a through 101d to read data elements from the off-chip external memory 104, and to write data elements to the off-chip external memory 104. These requests are defined in terms of on-chip bus transactions. The external memory controller translates these on-chip bus transactions into external memory bus transactions. External memory bus transactions are typically less generic than on-chip bus transactions. On-chip bus transactions are generic to allow for a number of different types of on-chip devices 101a through 101d with different types of requests to communicate. However, external memory transactions are different, being structured based on the characteristics of the external memory 104 in order to allow for efficient usage thereof.

The translation of on-chip bus transaction into external memory bus transactions influences the bandwidth efficiency for accessing of the external memory 104. An external memory 104 that operates at a certain clock frequency CLK_FREQ and that transfers N bits of data per clock cycle, has a theoretical bandwidth of CLK_FREQ*N bits per second This theoretical bandwidth gives an upper bound for a practical bandwidth. The practical bandwidth efficiency is primarily dependent on the external memory controller 102 translation process of translating on-chip bus transaction into external memory bus transactions. The higher the efficiency, the higher the memory bandwidth for a certain clock frequency. Thus, if the translation efficiency is higher, then this allows for the use of lower operating frequency memory parts, in order to reach a same desired memory bandwidth. Of course, lower operating frequency memory parts are known to be cheaper and, as a result, this is advantageous.

Double data rate SDRAM memories (DDR SDRAM) are capable of transferring N bits of data per clock cycle using only N/2 data pins on the external memory bus interface.

External memories 104, in the form of SDRAM having a plurality of banks, typically operate in one of the two data transfer modes of operation known to those of skill in the art—page mode and burst mode. In the page mode of operation, up to all data elements residing in a predetermined row within a predetermined SDRAM bank are transferable using a single SDRAM transaction. However, explicit terminate instructions are required to transfer less than all of the data elements residing in the predetermined row. In the burst mode of operation, a limited amount of data elements—known as a burst size—residing in a page within a SDRAM bank are transferable in a single SDRAM transaction. However, explicit terminate instructions are required in order to transfer less than the burst-size of data elements. For a typical SDRAM, the burst size is 4, 8, or 16 data elements in length.

An external memory transaction is typically formed of two parts: transaction setup overhead and transaction data transfer. Transaction setup overhead consists of external memory 104 precharge and activate operations used to prepare the memory circuit 104 for read/write access. Of course, the necessity of these operations is dependent on the prior state of banks within the SDRAM to which data is to be transferred, or from which data has been transferred. Transaction data transfer consists of SDRAM read or write operations. In the examples that follow, a burst mode of operation having a data transfer of 8 data elements—burst_size=8—will be utilized.

Mapping of an on-chip address 'A' from the SOC's unified memory architecture (UMA) onto a SDRAM address, is defined by a bank address (BA), a row address (RA), and a column address (CA). The mapping of the on chip address to the SDRAM address heavily influences the bandwidth efficiency to and from the SDRAM 104. Efficient mapping of the on-chip addresses to the SDRAM addresses determines a degree to which the SDRAM transaction setup overhead can be hidden for certain on-chip transaction types. Thus, if mapped efficiently, then data is transferred to/from the external memory simultaneously, while another external memory transaction is being setup.

For instance, one type of on-chip transactions may favor a certain SDRAM address mapping and another type of on-chip transactions may favor a different SDRAM address mapping. Best performance, i.e. optimal efficiency, is typically obtained when the addresses of the data elements referred to by the on-chip transaction are located in the same row of a certain memory bank 105a (limiting the amount of precharge and activate operations to a maximum of 1), or when the data elements referred to by the on-chip transaction are located in different banks (allowing for overlapping of transaction setup and transaction data transfer operations).

Figure 2:
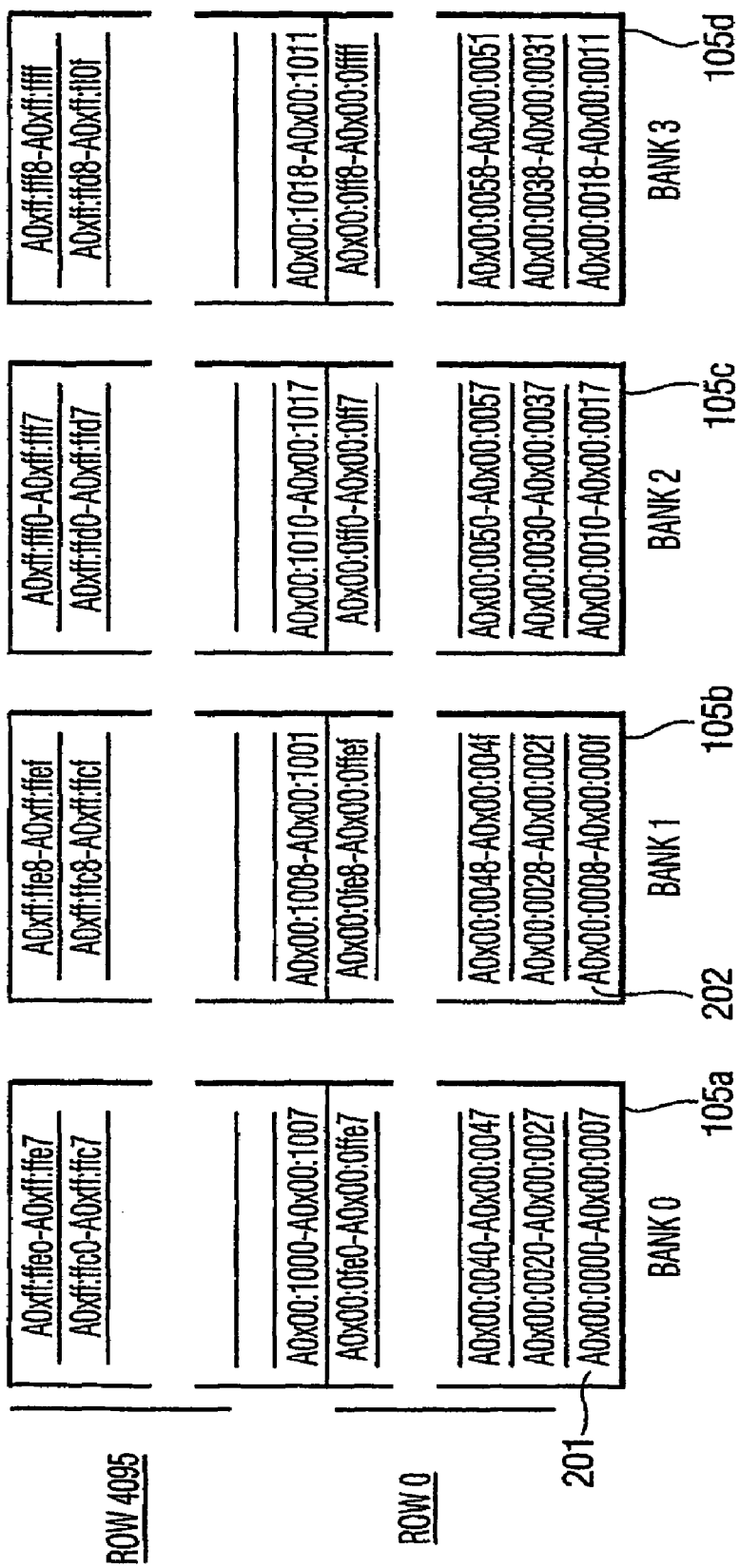
FIG. 2 illustrates prior art SDRAM address mapping using 8 data element bank interleaving assuming 12-bit row addresses and a 10-bit column addresses.
Figure 3:
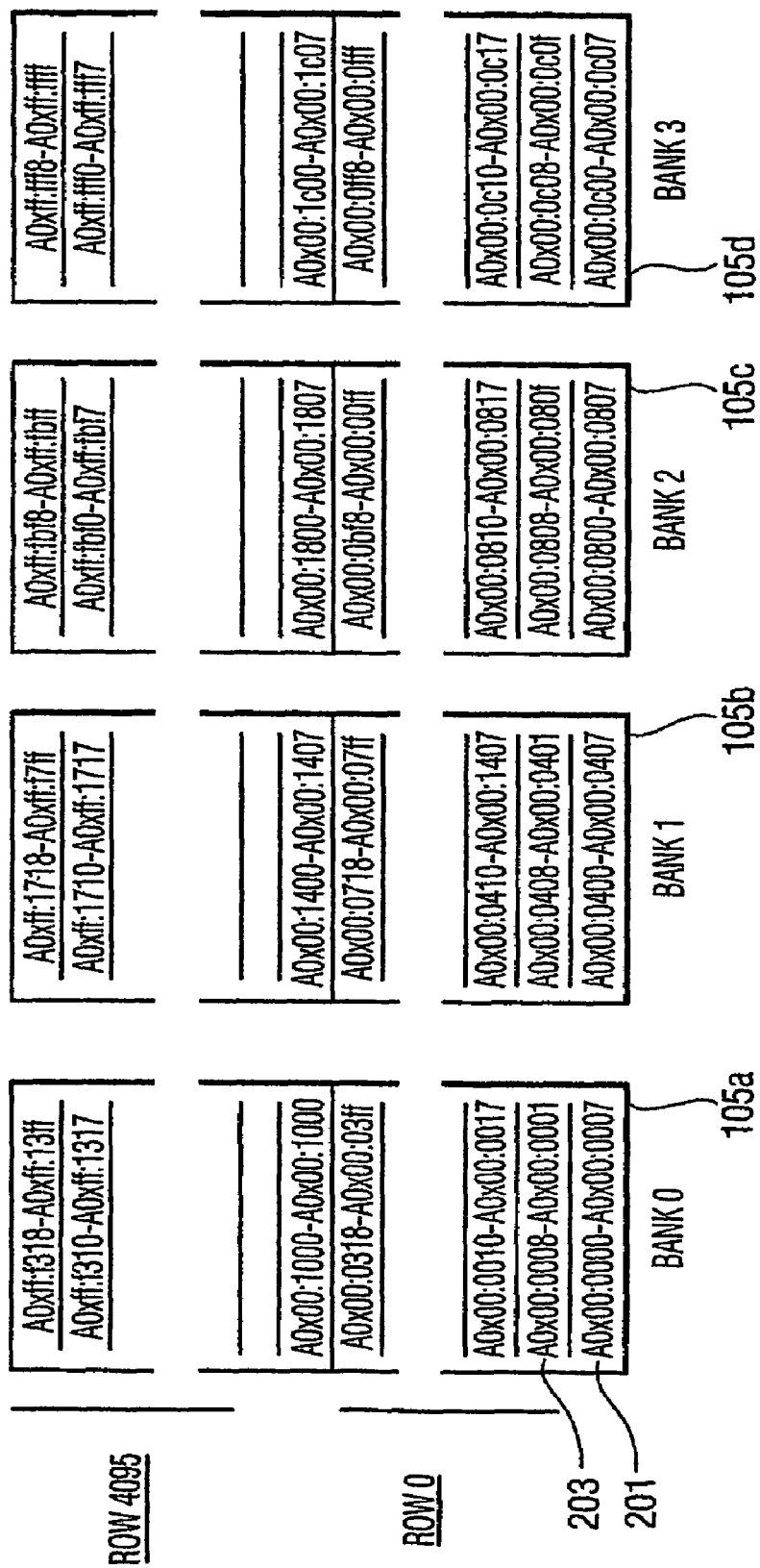
FIG. 3 illustrates prior art SDRAM address mapping using 1024 data element bank interleaving assuming 12-bit row addresses and a 10-bit column addresses.

FIG. 2 and FIG. 3 illustrate two different prior art address mapping schemes. FIG. 2 illustrates SDRAM address mapping using 8 data element memory bank interleaving, and FIG. 3 illustrates SDRAM address mapping using 1024 data element memory bank interleaving. In both cases for these examples, 12-bit row addresses (4096 rows), and 10-bit column addresses (1024 columns) are used.

In prior art FIG. 2, successive series of 8 data elements are located in a different memory bank of the external memory 104. In prior art FIG. 3, a successive series of 8 data elements are located in the same memory bank. In this case, once a row of a memory bank is full, subsequent data elements are written to a row of the next memory bank.

For FIG. 2 the following mapping scheme is applied using 12-bit RA, and 10-bit CA (8-byte interleaving):
BA=A[4:3]
RA=A[23:12]
CA={A[11:5], A[2:0]}

For FIG. 3 the following mapping scheme is applied using 12-bit RA, and 10-bit CA (1024-byte interleaving):
BA=A[10:11]
RA=A[23:12]
CA=A[9:0]

Both mapping schemes fill a row of a bank completely (for all banks 105a through 105d) before switching to the next row of the same bank. This is reflected by the fact that the row addresses are constructed using higher significant address bits of the on-chip address "A", than the column addresses.

For example, an on-chip transaction is requesting 32 data elements located at the on-chip addresses starting at an address "A", which is 32 data elements aligned. The external memory controller 102 partitions the on-chip transaction into four SDRAM transactions of 8 data elements (the burst-size), namely data elements [A, A+7], [A+8, A+15], [A+16, A+23], and [A+24, A+31].

In the SDRAM mapping shown in FIG. 2, the four SDRAM transactions access different memory banks. As a result, the SDRAM transaction setup overhead is hidden to a certain extent by overlapping the precharge and activate operations of a later SDRAM transaction with the data transfer of a previous SDRAM transaction, resulting in higher bandwidth efficiency. Assuming all of these on-chip transactions follow the same memory bank access pattern because of the 32 data element alignment restriction, the transaction setup resulting from a later on-chip transaction overlaps with the data transfer resulting from previous on-chip transactions, thus increasing bandwidth efficiency.

In the SDRAM mapping of FIG. 3, the four SDRAM transactions access the same memory bank 105a. Due to the 32 data element alignment restriction and the assumption that the memory bank row size is an integer multiple of 32 data elements, the four SDRAM transactions access the same row within a bank. As a result, the SDRAM transaction overhead is limited since precharge and activate operations need to be performed at most once for all four SDRAM transactions, thus resulting in a high bandwidth efficiency. However, the overlapping of the transaction setup overhead resulting from a later on-chip transaction with the data transfer resulting from previous on-chip transactions is not necessarily possible in this case. Assuming a uniform distribution of on-chip transaction start addresses, there is a 25% chance, since there are four memory banks in the SDRAM memory, that a subsequent transaction will map onto the same bank. The chance of these subsequent on-chip transactions mapping on the same row of the same bank is small. As a result, the possibility of an overlapping transaction setup overhead resulting from a later on-chip transaction with the data transfer resulting from previous on-chip transactions becomes smaller than in the previous mapping of FIG. 2. In other words, the second mapping scheme (FIG. 3) has the lower bandwidth efficiency than the first mapping scheme (FIG. 2).

TABLE 1

Bandwidth efficiency for 32 data element aligned transactions for different bank interleaving numbers

| Interleaving | Bandwidth Efficiency |
|---|---|
| 8 | 89.9 |
| 16 | 87.3 |
| 32 | 81.8 |
| 64 | 81.6 |
| 128 | 82.2 |
| 256 | 81.4 |
| 512 | 81.5 |
| 1024 | 81.7 |
| 2048 | 81.8 |
| 4096 | 81.1 |

The results from simulating different bank interleaving numbers are given in Table 1 using a DDR SDRAM operating at a frequency of 200 MHz Note the lower efficiency of 1024-byte interleaving (81.7%) versus 8-byte interleaving (89.9%).

Besides linear transactions, on-chip devices may generate two-dimensional transactions. Two-dimensional transactions are typical, but not limited, for video accelerators performing video motion estimation and compensation functionality. An example of an on-chip two-dimensional transaction is requesting blocks of 24 by 5 data elements located at on-chip addresses starting at an on chip address "A". The block is said to have a line size of 24 and therefore requests 5 lines. Two-dimensional transactions have a stride associated with them to indicate spacing between the successive lines within a transaction. Assuming a stride of 2048, the above specified two-dimensional transaction requests data elements at addresses [A, A+23], [A+2048, A+2071], [A+4096, A+4119], [A+6144, A+6167], and [A+8192, A+8215]. The external memory controller partitions the on-chip transaction into multiple SDRAM transactions of 8 or fewer data elements, with 8 data elements being the burst-size in this example. Using a start address 'A' that equals 4, the external memory controller generates the following external transactions: For the first line: [4, 7], [8, 15], [16, 23], [24, 27], and for the second line: [2052, 2055], [2056, 2063], [2064, 2071], [2072, 2075], etc. Every line results in four external transactions, the first and last of these transactions transfer 4 data elements.

In the SDRAM mapping of prior art FIG. 2, our two-dimensional SDRAM transaction is accessing multiple SDRAM banks, and within a SDRAM bank possibly multiple rows. As a result, the SDRAM transaction overhead is large because both precharge and activate operations need to be performed, which result in a low bandwidth efficiency.

In the SDRAM mapping of prior art FIG. 3, out two-dimensional SDRAM transaction is accessing multiple SDRAM banks, and within a SDRAM bank possibly multiple rows. Although the mapping is different from the mapping of FIG. 2, similar problems arise as a consequence of the strided, non-sequential, nature of the transactions. As a result, the SDRAM transaction overhead is large since precharge and activate operations need to be performed, thus resulting in low bandwidth efficiency.

Unfortunately, for both mappings (FIG. 2 and FIG. 3) the two-dimensional transaction has poor bandwidth efficiency. The results of simulating different bank interleaving numbers are given in Table 2. These numbers were obtained using a DDR SDRAM operating at a frequency of 200 MHz.

TABLE 2

Bandwidth efficiency for two-dimensional 24 by 5 transactions (2048 element stride), for different bank interleaving numbers

| Interleaving | Bandwidth Efficiency |
|---|---|
| 8 | 60.4 |
| 16 | 61.8 |
| 32 | 62.9 |
| 64 | 63.0 |
| 128 | 63.1 |
| 256 | 62.2 |
| 512 | 64.4 |
| 1024 | 63.2 |
| 2048 | 62.9 |
| 4096 | 63.1 |

Note the low efficiency of two-dimensional 24 by 5 transactions (2048 element stride) for 1024-byte interleaving (63.2%) and 8-byte interleaving (60.4%).

In accordance with an embodiment of the invention, an address mapping which has improved efficiency for two-dimensional transactions is proposed. For this address mapping a stride is given by $2^N$, in which N is an integer and $2^N$ is greater or equal than the 4* burst_size. In this example, $N \geq 5$ since $2^5 \geq (4*8) = (4*burst\_size)$.

In accordance with the apparatus shown in FIG. 5, and the method steps illustrated in FIG. 4, an embodiment of the invention is shown. A transaction by an on-chip device 508 generates a request for storage 401 of a single data line 507 having data elements for storage at a location within external memory 510, governed by an on chip address "A". The on-chip device 508 provides the single data line for storage 507 to an external memory controller 506. Both the on-chip device 508 and the external memory controller 506 are located on chip, within an on-chip boundary 509. The external memory controller 506 segments 402 the data line for storage 507 into data portions (504 and 505). Each portion consists of fewer data elements than a number of data elements used for filling a data line 501 or 503 contained within a bank 511 in external memory 510, in the form of an SDRAM. Using a data line size that is smaller or equal to 3*burst-size, the external memory controller 506 generates an external memory requests for a single data line (504 and 505), which accesses different memory banks (511 and 512). Each of the data portions of data elements (504 or 505) are stored 403 within one of a different data lines (501 and 502 and 503), located within the external memory 510, and a same data line (501 and 502), within different banks (511 and 512), of the external memory 510. The BA, CA and RA govern locations of these data portions. The BA, CA and RA are external memory specific and are determined from the on-chip address "A" as described hereinbelow. Additionally, the BA, CA and RA are dependent upon a value for a stride used to separate the data portions 504 and 505 by the external memory controller 506.

Of course, a reverse of the aforementioned process is performed for reading of data elements from the external memory 510. Whereby, the external memory controller 506 accesses the external memory 510 and reads data portions 504 and 505 located therefrom. Once read, the data portions 504 and 505 are combined into a single data line 507 for use by the on-chip device 508. The external memory controller still accesses the external memory using the BA, CA and the RA to locate the data portions in the external memory prior to recombining them into a single data line 507 for use by the on chip device 508

This process in accordance with en embodiment of the invention advantageously allows for overlapping of transaction setup and transaction data transfer operations. At the same time, the external memory request for different data lines follows the same memory bank access pattern Using a stride of 1024 data elements (N=10), the following mapping scheme is proposed for locating data portions 504 and 505, for storage and readback, in the external memory 510 using 12-bit row addresses and 10-bit column addresses:

BA=A[4:3]
RA={A [23:17], A [9:5]}
CA={A[16:10], A[2:0]}

This mapping scheme assures that lines that are 1024 data elements a part, the stride size, are likely map onto the same row. For example, if a first line of a transaction starts at address 2048 (BA=0, RA=0, CA=0×010), a second line of the transaction starts at address 3072 (BA=0, RA=0, CA=0× 018), a third line of the transaction starts at address 4096 (BA=0, RA=0, CA=0×020), etc. Since the same row is used for multiple lines of the two-dimensional transaction, the transaction setup overhead is limited For bust mode interleaving, the following mapping scheme is utilized:

BA=A[4:3]
RA=A [23:12]
CA={A[11:5], A[2:0]}

In this case, for burst mode interleaving, a first line of a transaction is located at address 2048 (BA=0, RA=0, CA=0× 800), and a second line of the transaction is located at address 3072 (BA=0, RA=0, CA=0×c00). However, a third line of the transaction at address 4096 (BA=0, RA=1, CA=0×000) is located in a different row, resulting in transaction setup overhead.

Using a stride of 2048 data elements (N=11), the following mapping scheme is proposed for locating data portions 504 and 505, for storage and readback, in the external memory 510 using 12-bit row addresses and 10-bit column addresses:

BA=A[4:3]
RA={A[23:18], A[10:5]}
CA={A[17:1], A[2:0]}

For this scheme, the same row is used for multiple lines of a two dimensional transaction. For both stride sizes, the proposed mapping schemes do not fill a certain row 501 completely, for all banks, before switching to the next row 502, like in the two prior art mapping schemes (FIG. 2 and FIG. 3). This is reflected by the fact that the row addresses are constructed using some address bits of the on-chip address "A" that have a lower significance than some of the address bits used to construct the column addresses.

The results of simulating for a 2048 data element stride numbers are given in Table 3. These numbers were obtained using a DDR SDRAM operating at a frequency of 200 MHz.

TABLE 3

Bandwidth efficiency for a two-dimensional 24 by 5 transactions (2048 element stride) using the proposed mapping scheme

| Proposed Scheme | Bandwidth Efficiency |
| --- | --- |
| | 75.9 |

The 75.9% efficiency of the proposed scheme is significantly higher than the efficiency obtained for 8-byte interleaved address mapping (60.4%), and 1024-byte interleaved address mapping (63.2%). Thus, the proposed mapping scheme optimizes bandwidth efficiency for two-dimensional 2048 stride size transactions and provides functional correctness for many different types of transactions.

The proposed mapping scheme, optimized for two-dimensional transactions, achieves significantly improved bandwidth efficiency than traditional mapping schemes. The improved bandwidth efficiency allows the system to be equipped with memory parts operating at a lower frequency. Traditional interleaving mapping schemes deliver a maximum bandwidth efficiency of 64.4%, whereas the mapping scheme in accordance with the embodiment of the invention delivers a bandwidth efficiency of 75.9%. As a result, for a 32-bit 200 MHz DDR memory, an effective bandwidth of $200*10^6*32*2*0.759 \geq 9.7*10^9$ bits/second is achieved, and a traditional scheme would require memory parts operating at a frequency of $9.7*10^9/(32*2*0.644) \sim 235$ MHz, assuming of course that the 64.4% efficiency number is achievable at this frequency. To those of skill in the art it is known that higher frequency memory parts are typically significantly costlier than lower frequency parts, especially if their use is not widespread in the mainstream market.

Besides allowing for system cost reduction, the proposed mapping scheme also allows for SOC functionality, which is unattainable for systems equipped with traditional mapping schemes. This becomes apparent when certain SOC functionality requires an effective bandwidth of $9.5*10^9$ bits/second, and the highest available frequency for memory parts is 200 Mf. As the previous calculations shows, traditional schemes are unable to deliver the required bandwidth at 200 MHz. Modem SOCs, such as those used for high definition MPEG-2 video support, make use of two-dimensional transactions and thus typically require a high amount of memory bandwidth.

Besides the efficiency of an address mapping scheme and the frequency of memory parts, another way to achieve high memory bandwidth is to increase the data bus size. Moving from a 32-bit data bus to a 64 bit data bus of course doubles the memory bandwidth. However, this solution for achieving higher memory bandwidth requires at least 32 new data bus pins, which directly translates into a higher chip package cost as well as additional manufacturing complexity.

The proposed scheme advantageously reduces system cost, since it either reduces the cost of memory parts, or it reduces packaging costs associated with the die. Furthermore the system supports SOC functionality, which is not within reach with traditional prior art schemes.

Of course, the proposed mapping scheme is for two-dimensional transactions, it does still guarantee functional correctness for transactions of a different type, but the efficiency may be less. That said, it is possible to extrapolate/generalize the mapping scheme to different stride values as will be evident to those of skill in the art using similar concepts to those presented herein.

Numerous other embodiments may be envisaged without departing from the spirit or scope of the invention.

What is claimed is:

1. A method of storing data in an external memory comprising the steps of: providing data for storage in the external memory; segmenting the data for storage into data portions, each portion consisting of fewer data elements than a number of data elements for filling a data line contained within a bank in the external memory; and, storing each portion of data elements within one of a different data line located within the external memory and a same data line within different banks of the external memory.

2. A method of storing data according to claim 1, wherein each portion of data elements is separated from another by a stride having a value of $2^N$, where N is an integer that is other than zero.

3. A method of storing data according to claim 2, wherein a value for $2^N$ is greater than 4 times a burst size for accessing of the external memory.

4. A method of storing data according to claim 1, comprising the steps of: providing an external memory controller for performing the step of segmenting.

5. A method of storing data according to claim 1, wherein the external memory comprises a synchronous dynamic random access memory (SDRAM).

6. A method of storing data according to claim 4, comprising the steps of: providing an external memory controller for performing the steps of reading of data elements from the external memory.

7. A method of storing data according to claim 6, wherein during the step of reading of data elements from the external memory, the external memory controller generates a single request for a single line to the external memory, which results in a number of data elements to be retrieved from the external memory, the number of data elements being larger than that used for filling a line located within a bank in the external memory.

8. A method of storing data according to claim 7, wherein during a step of reading the single line from the external memory, more than one bank is accessed in the external memory.

9. A method of storing data according to claim 6, wherein during the steps of reading of data elements from the external memory and of storing of data elements to the external memory the external memory controller comprises the steps of: transaction setup and of transaction data transfer.

10. A method of storing data according to claim 4, comprising the steps of: providing an on chip address to the external memory controller; and, using the on chip address to determine a bank address, a row address and a column address, wherein the bank address is used to address a bank in memory, and the row address is used to access the line contained within the bank.

11. A method of storing data according to claim 10, comprising the steps of: constructing the row address from the on chip address using a first set and a second set of address bits from the on chip address; and, constructing the column address from the on chip address using a third set and a fourth set of address bits from the on chip address, wherein the first set of address bits has a higher significance than the third set of address bits and the second set of address bits has a higher significance than the fourth set of address bits.

12. An apparatus comprising: a first memory bank having a first memory location in the form of a data line for storing a number of data elements; a second memory bank having a second memory location in the form of a data line for storing a same number of data elements; and, a memory controller circuit for receiving a data line of data elements for storage and for segmenting the data line of data elements into data portions, each portion consisting of fewer data elements than the number of data elements for filling a data line contained within the first bank and the second bank in the external memory.

13. An apparatus according to claim 12, comprising: a memory access circuit supporting a stride that separates each of the data portions stored in the external memory bank, where the stride has a value of $2^N$ where N is an integer that is other than zero.

14. An apparatus according to claim 12, comprising: a memory access circuit supporting a stride that separates each of the data portions stored in the external memory bank, where the stride has a value of $2^N$ where N is an integer that is other than zero, and a memory access circuit supporting a a burst size, where a value for the stride is the burst size.

15. An apparatus according to claim 13, wherein the external memory comprises a synchronous dynamic random access memory (SDRAM).

16. An apparatus according to claim 13, wherein the external memory comprises an on chip address storage location, wherein data stored within the on chip address storage location is used to determine at least one of a bank address, a row address and a column for use in accessing of the external memory.

17. A method of writing a line of data elements comprising the steps of: providing a first memory bank having a first memory location in the form of a data line for storing a number of data elements; providing a second memory bank having a second memory location in the form of a data line for storing a same number of data elements; segmenting the data line of data elements into data portions, each portion consisting of fewer data elements than a number of data elements for filling a data line located in each of a first and a second bank in the external memory; writing the first portion of data elements to the first memory location within the first memory bank; terminating the writing of the first portion data elements to the first memory location prior to complete filling of the first memory location; switching to the second memory bank; writing the second portion of data elements to the second memory location within the second memory bank; and, terminating the writing of the second portion data elements to the second memory location prior to completely filling of the second memory location.

* * * * *